US010256863B2

(12) United States Patent
Gu et al.

(10) Patent No.: US 10,256,863 B2
(45) Date of Patent: Apr. 9, 2019

(54) MONOLITHIC INTEGRATION OF ANTENNA SWITCH AND DIPLEXER

(71) Applicant: QUALCOMM INCORPORATED, San Diego, CA (US)

(72) Inventors: Shiqun Gu, San Diego, CA (US); Chengjie Zuo, San Diego, CA (US); Steve Fanelli, San Marcos, CA (US); Thomas Gee, Poway, CA (US); Young Kyu Song, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/151,285

(22) Filed: May 10, 2016

(65) Prior Publication Data

US 2017/0201291 A1 Jul. 13, 2017

Related U.S. Application Data

(60) Provisional application No. 62/277,451, filed on Jan. 11, 2016.

(51) Int. Cl.
*H04B 1/48* (2006.01)
*H01L 21/84* (2006.01)
(Continued)

(52) U.S. Cl.
CPC ......... *H04B 1/48* (2013.01); *H01L 21/76251* (2013.01); *H01L 21/76898* (2013.01);
(Continued)

(58) Field of Classification Search
CPC .................. H01L 27/0617–27/101; H01L 23/5222–23/5225; H01L 27/0629;
(Continued)

(56) References Cited

U.S. PATENT DOCUMENTS 8,786,079 B2  7/2014  Lee et al.
8,836,418 B2  9/2014  Sugiura
(Continued)

FOREIGN PATENT DOCUMENTS

EP        2814053 A1    12/2014

OTHER PUBLICATIONS

International Search Report and Written Opinion—PCT/US2016/063973—ISA/EPO—dated Mar. 7, 2017.
(Continued)

*Primary Examiner* — Moazzam Hossain
*Assistant Examiner* — Stanetta D Isaac
(74) *Attorney, Agent, or Firm* — Qualcomm Incorporated/Seyfarth Shaw LLP

(57) ABSTRACT

An integrated radio frequency (RF) circuit structure may include a resistive substrate material and a switch. The switch may be arranged in a silicon on insulator (SOI) layer supported by the resistive substrate material. The integrated RF circuit structure may also include an isolation layer coupled to the SOI layer. The integrated RF circuit structure may further include a filter, composed of inductors and capacitors. The filter may be arranged on a surface of the integrated RF circuit structure, opposite the resistive substrate material. In addition, the switch may be arranged on a first surface of the isolation layer.

20 Claims, 18 Drawing Sheets

(51) Int. Cl.
| | |
|---|---|
| *H01L 23/48* | (2006.01) |
| *H01L 23/60* | (2006.01) |
| *H01L 23/66* | (2006.01) |
| *H01L 27/12* | (2006.01) |
| *H01L 29/06* | (2006.01) |
| *H01L 49/02* | (2006.01) |
| *H01L 21/762* | (2006.01) |
| *H01L 21/768* | (2006.01) |
| *H01L 23/522* | (2006.01) |

(52) U.S. Cl.
CPC ............ *H01L 21/84* (2013.01); *H01L 23/481* (2013.01); *H01L 23/5223* (2013.01); *H01L 23/5227* (2013.01); *H01L 23/60* (2013.01); *H01L 23/66* (2013.01); *H01L 27/1203* (2013.01); *H01L 28/00* (2013.01); *H01L 28/10* (2013.01); *H01L 28/60* (2013.01); *H01L 29/0649* (2013.01); *H01L 2223/6672* (2013.01); *H01L 2223/6677* (2013.01)

(58) Field of Classification Search
CPC ............. H01L 27/0676; H01L 27/0682; H01L 27/0716; H01L 27/0722; H01L 27/0727; H01L 27/0733; H01L 27/0788; H01L 27/0794; H01L 27/0805; H01L 27/12
See application file for complete search history.

(56) References Cited

U.S. PATENT DOCUMENTS

| | | |
|---|---|---|
| 2006/0105496 A1 | 5/2006 | Chen et al. |
| 2008/0020488 A1 | 1/2008 | Clevenger et al. |
| 2013/0037924 A1* | 2/2013 | Lee .................. H01L 23/66 257/664 |
| 2014/0327496 A1 | 11/2014 | Zuo et al. |
| 2015/0049982 A1* | 2/2015 | Qi .................. G02B 6/12007 385/14 |
| 2015/0137307 A1 | 5/2015 | Stuber et al. |
| 2015/0145614 A1 | 5/2015 | Whitefield et al. |
| 2016/0294366 A1* | 10/2016 | Bao .................. G05F 3/205 |

OTHER PUBLICATIONS

Giansello F., et al., "Integration of Cellular Front End Modules on Advanced High Resistivity SOI RF CMOS Technology," IEEE Topical Conference on Power Amplifiers for Wireless and Radio Applications (PAWR), 2011, p. 29-32.

* cited by examiner

MONOLITHIC INTEGRATION OF ANTENNA SWITCH AND DIPLEXER

CROSS-REFERENCE TO RELATED APPLICATION

This application claims the benefit under 35 U.S.C. § 119(e) to U.S. Provisional Patent Application No. 62/277,451, entitled "MONOLITHIC INTEGRATION OF ANTENNA SWITCH AND DIPLEXER," filed on Jan. 11, 2016, the disclosure of which is expressly incorporated by reference herein in its entirety.

TECHNICAL FIELD

The present disclosure generally relates to integrated circuits (ICs). More specifically, the present disclosure relates to monolithic integration of an antenna switch and a diplexer.

BACKGROUND

For wireless communication, a diplexer can help process signals carried in a carrier aggregation system. In carrier aggregation systems, signals are communicated with both high band and low band frequencies. In a chipset, the diplexer is usually inserted between an antenna and a tuner (or a radio frequency (RF) switch) to ensure high performance. Usually, a diplexer design includes inductors and capacitors. Diplexers can attain high performance by using inductors and capacitors that have a high quality (Q)-factor. High performance diplexers can also be attained by reducing the electromagnetic coupling between components, which may be achieved through an arrangement of the geometry and direction of the components. Diplexer performance may be quantified by measuring the insertion loss and rejection (e.g., quantities expressed in decibels (dB)) at certain frequencies.

The diplexer fabrication process may be compatible with standard semiconductor processes, such as processes for fabricating voltage-controlled capacitors (varactors), switched-array capacitors, or other like capacitors. It may be beneficial to fabricate the components of the diplexer design on a single substrate. Fabrication on a single substrate may also enable tunable diplexers that are tuned through a variety of different parameters.

Fabricating high performance diplexers in an efficient and cost-effective manner is problematic. Increasing the Q-factor of the inductors and the capacitors in the diplexer is also an issue. Reducing the electromagnetic coupling between the various components in the diplexer, while decreasing the size of the diplexer and making the most economical use of resources, would be beneficial.

SUMMARY

An integrated radio frequency (RF) circuit structure may include a resistive substrate material and a switch. The switch may be arranged in a silicon on insulator (SOI) layer supported by the resistive substrate material. The integrated RF circuit structure may also include an isolation layer coupled to the SOI layer. The integrated RF circuit structure may further include a filter, composed of inductors and capacitors. The filter may be arranged on a surface of the integrated RF circuit structure, opposite the resistive substrate material. In addition, the switch may be arranged on a first surface of the isolation layer.

A method of constructing an integrated radio frequency (RF) circuit structure may include fabricating a switch in a silicon on insulator (SOI) layer supported by a resistive substrate material. The method may also include fabricating a filter composed of inductors and capacitors, supported by the switch. The method may further include fabricating a via coupling the filter and the switch through a dielectric material.

An integrated radio frequency (RF) circuit structure may include a resistive substrate material and a means for switching. The switching means may be arranged in a silicon on insulator (SOI) layer supported by the resistive substrate material. The integrated RF circuit structure may also include an isolation layer coupled to the SOI layer. The integrated RF circuit structure may further include a filter, composed of inductors and capacitors. The filter may be arranged on a surface of the integrated RF circuit structure, opposite the resistive substrate material. In addition, the switching means may be arranged on a first surface of the isolation layer.

A radio frequency (RF) front end module may include an integrated radio frequency (RF) circuit structure. The integrated RF circuit structure may include a resistive substrate material and a switch. The switch may be arranged in a silicon on insulator (SOI) layer supported by the resistive substrate material. The integrated RF circuit structure may also include an isolation layer coupled to the SOI layer. The integrated RF circuit structure may further include a filter, composed of inductors and capacitors. The filter may be arranged on a surface of the integrated RF circuit structure, opposite the resistive substrate material. In addition, the switch may be arranged on a first surface of the isolation layer. The RF front end module may also include an antenna coupled to an output of the switch.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1A:
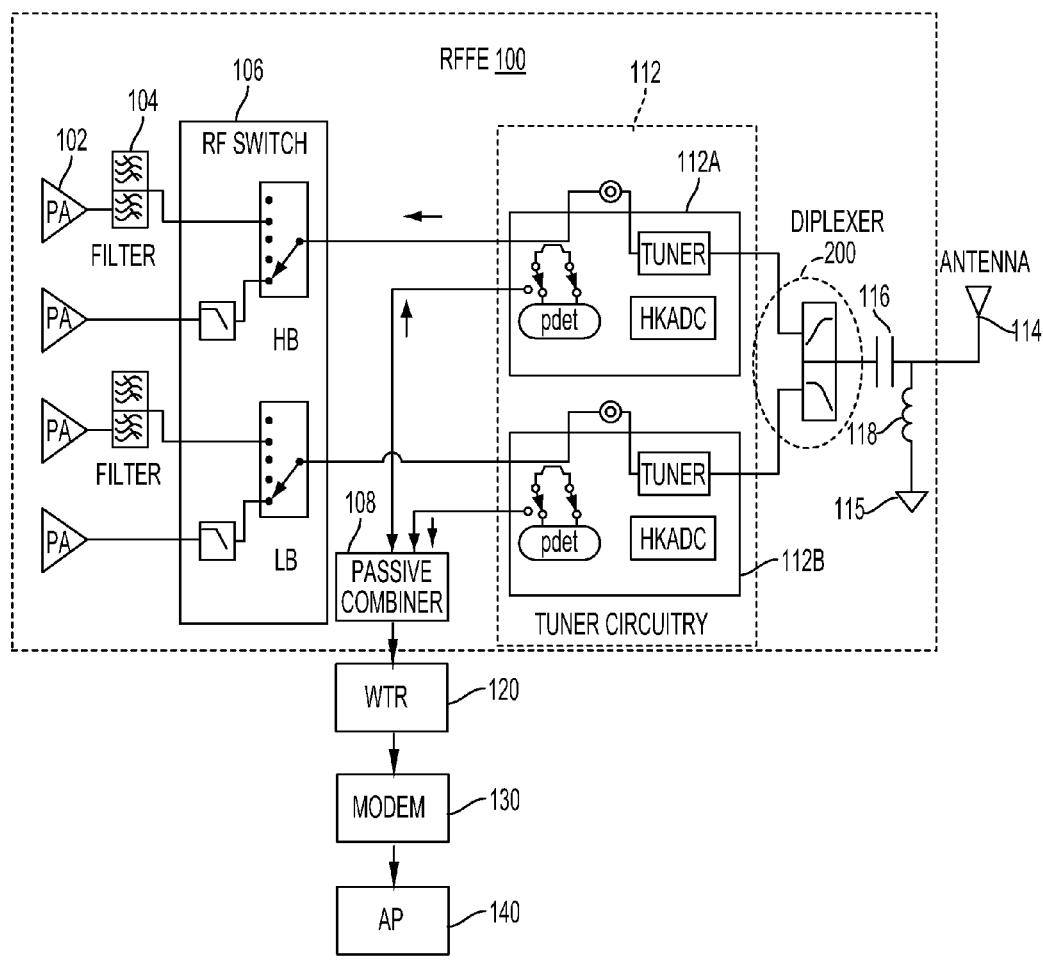
FIG. 1A is a schematic diagram of a radio frequency (RF) front end (RFFE) module employing a diplexer according to an aspect of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Mobile radio frequency (RF) chip designs (e.g., mobile RF transceivers) have migrated to a deep sub-micron process node due to cost and power consumption considerations. The design complexity of mobile RF transceivers is further complicated by added circuit functions to support communication enhancements, such as carrier aggregation. Further design challenges for mobile RF transceivers include analog/RF performance considerations, including mismatch, noise and other performance considerations. The design of these mobile RF transceivers includes the use of passive devices, for example, to suppress resonance, and/or to perform filtering, bypassing and coupling.

Successful fabrication of modern semiconductor chip products involves interplay between the materials and the processes employed. In particular, the formation of conductive material plating for semiconductor fabrication in back-end-of-line (BEOL) processes is an increasingly challenging part of the process flow. This is particularly true in terms of maintaining a small feature size. The same challenge of maintaining a small feature size also applies to passive on glass (POG) technology, where high performance components such as inductors and capacitors are built upon a highly insulative substrate that may also have a very low loss.

Passive on glass devices involve high performance inductor and capacitor components that have a variety of advantages over other technologies, such as surface mount technology or multi-layer ceramic chips. These advantages include being more compact in size and having smaller manufacturing variations. Passive on glass devices also involve a higher quality (Q)-factor value that meets stringent low insertion loss and low power consumption specifications. Devices such as inductors may be implemented as 3D structures with passive on glass technologies. 3D through substrate inductors or other 3D devices may also experience a number of design constraints due to their 3D implementation.

An inductor is an example of an electrical device used to temporarily store energy in a magnetic field within a wire coil according to an inductance value. This inductance value provides a measure of the ratio of voltage to the rate of change of current passing through the inductor. When the current flowing through an inductor changes, energy is temporarily stored in a magnetic field in the coil. In addition to their magnetic field storing capability, inductors are often used in alternating current (AC) electronic equipment, such as radio equipment. For example, the design of mobile RF transceivers includes the use of inductors with improved inductance density while reducing magnetic loss at high frequency.

Various aspects of the disclosure provide techniques for monolithic integration of an antenna switch and diplexers/filters in integrated RF circuit structures. The process flow for semiconductor fabrication of the integrated RF circuit structure may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms chip and die may be used interchangeably unless such interchanging would tax credulity.

Aspects of the present disclosure describe monolithic integration of an antenna switch and diplexers/filters in integrated RF circuit structures for high quality (Q)-factor RF applications. In one arrangement, an integrated RF circuit structure includes a switch arranged in a silicon on insulator (SOI) layer supported by a resistive substrate material. The integrated RF circuit structure further includes a filter composed of inductors and capacitors, supported by the switch. In one aspect of the present disclosure, the resistive material is a handle substrate including an isolation layer (e.g., a buried oxide (BOX) layer) directly on the handle substrate and supporting the SOI layer. In this arrangement, the filter is stacked directly on a dielectric layer supported by the SOI layer and coupled to the switch through the dielectric layer. In another aspect of the present disclosure, the switch and the filter are arranged on opposing surfaces of the isolation layer. In this arrangement, the SOI layer is supported by a high resistance carrier wafer composed of glass, sapphire, trap rich high resistance silicon, or other like material.

FIG. 1A is a schematic diagram of a radio frequency (RF) front end (RFFE) module 100 employing a diplexer 200 according to an aspect of the present disclosure. The RF front end module 100 includes power amplifiers 102, duplexer/filters 104, and a radio frequency (RF) switch module 106. The power amplifiers 102 amplify signal(s) to a certain power level for transmission. The duplexer/filters 104 filter the input/output signals according to a variety of different parameters, including frequency, insertion loss, rejection or other like parameters. In addition, the RF switch module 106 may select certain portions of the input signals to pass on to the rest of the RF front end module 100.

The RF front end module 100 also includes tuner circuitry 112 (e.g., first tuner circuitry 112A and second tuner circuitry 112B), the diplexer 200, a capacitor 116, an inductor 118, a ground terminal 115 and an antenna 114. The tuner circuitry 112 (e.g., the first tuner circuitry 112A and the second tuner circuitry 112B) includes components such as a tuner, a portable data entry terminal (PDET), and a house keeping analog to digital converter (HKADC). The tuner circuitry 112 may perform impedance tuning (e.g., a voltage standing wave ratio (VSWR) optimization) for the antenna 114. The RF front end module 100 also includes a passive combiner 108 coupled to a wireless transceiver (WTR) 120. The passive combiner 108 combines the detected power from the first tuner circuitry 112A and the second tuner circuitry 112B. The wireless transceiver 120 processes the information from the passive combiner 108 and provides this information to a modem 130 (e.g., a mobile station modem (MSM)). The modem 130 provides a digital signal to an application processor (AP) 140.

As shown in FIG. 1A, the diplexer 200 is between the tuner component of the tuner circuitry 112 and the capacitor 116, the inductor 118, and the antenna 114. The diplexer 200 may be placed between the antenna 114 and the tuner circuitry 112 to provide high system performance from the RF front end module 100 to a chipset including the wireless transceiver 120, the modem 130 and the application processor 140. The diplexer 200 also performs frequency domain multiplexing on both high band frequencies and low band frequencies. After the diplexer 200 performs its frequency multiplexing functions on the input signals, the output of the diplexer 200 is fed to an optional LC (inductor/capacitor) network including the capacitor 116 and the inductor 118. The LC network may provide extra impedance matching components for the antenna 114, when desired. Then a signal with the particular frequency is transmitted or received by the antenna 114. Although a single capacitor and inductor are shown, multiple components are also contemplated.

Figure 1B:
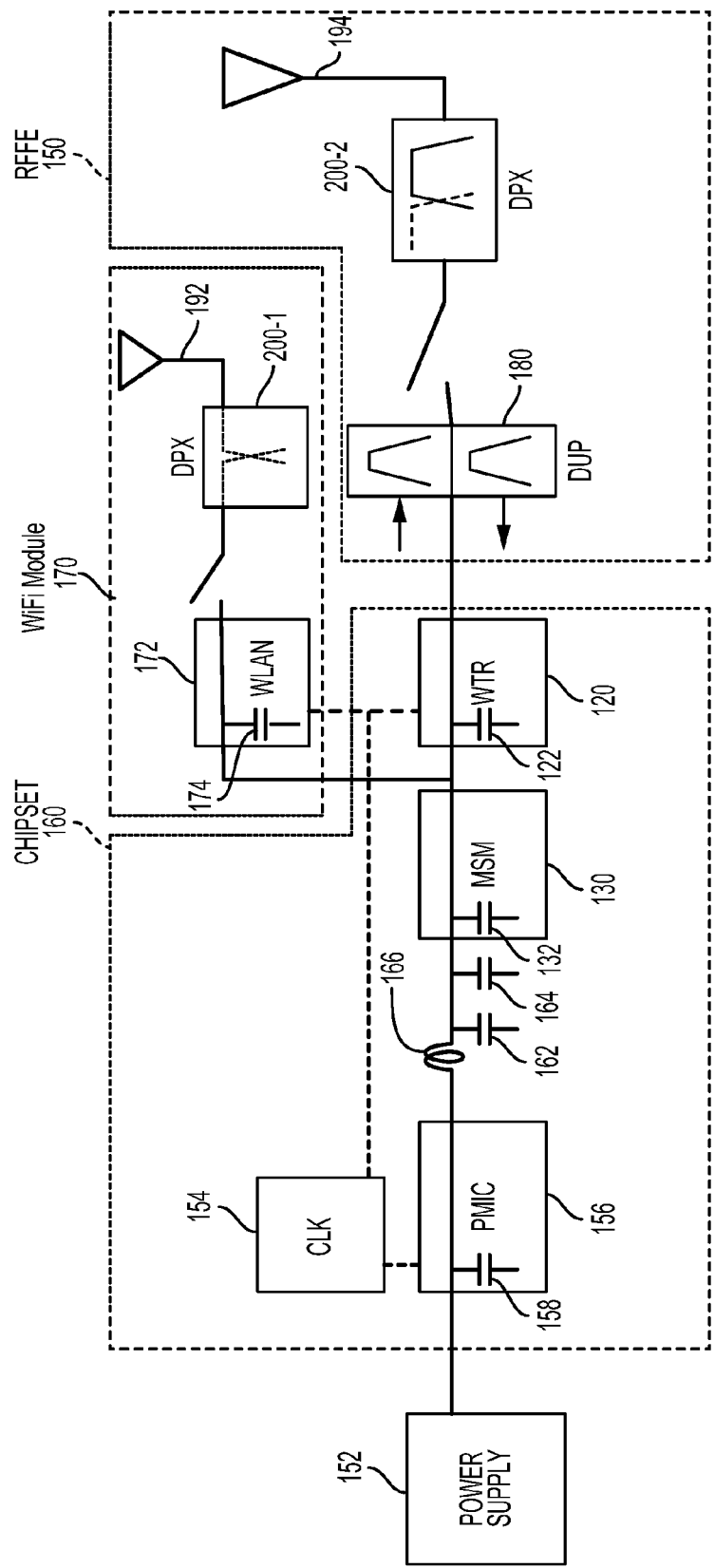
FIG. 1B is a schematic diagram of a radio frequency (RF) front end (RFFE) module employing diplexers for a chipset to provide carrier aggregation according to aspects of the present disclosure.

FIG. 1B is a schematic diagram of a WiFi module 170 including a first diplexer 200-1 and an RF front end module 150 including a second diplexer 200-2 for a chipset 160 to provide carrier aggregation according to an aspect of the present disclosure. The WiFi module 170 includes the first diplexer 200-1 communicably coupling an antenna 192 to a wireless local area network module (e.g., WLAN module 172). The RF front end module 150 includes the second diplexer 200-2 communicably coupling an antenna 194 to the wireless transceiver (WTR) 120 through a duplexer 180. The wireless transceiver 120 and the WLAN module 172 of the WiFi module 170 are coupled to a modem (MSM, e.g., baseband modem) 130 that is powered by a power supply 152 through a power management integrated circuit (PMIC) 156. The chipset 160 also includes capacitors 162 and 164, as well as an inductor(s) 166 to provide signal integrity. The PMIC 156, the modem 130, the wireless transceiver 120, and the WLAN module 172 each include capacitors (e.g., 158, 132, 122, and 174) and operate according to a clock 154. The geometry and arrangement of the various inductor and capacitor components in the chipset 160 may reduce the electromagnetic coupling between the components.

Figure 2A:
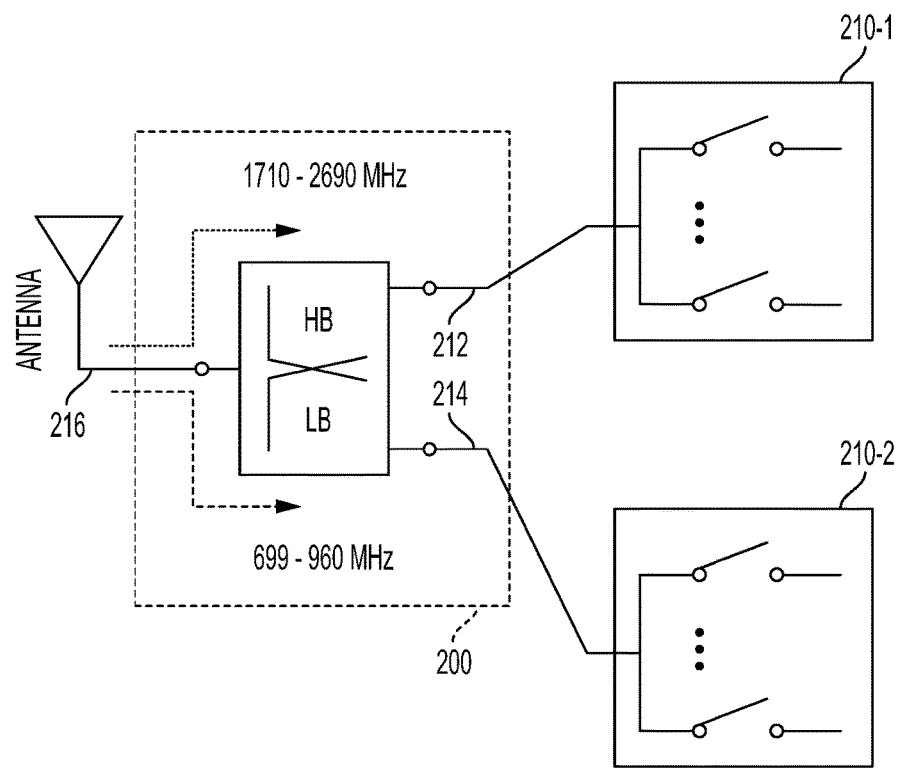
FIG. 2A is a diagram of a diplexer design according to an aspect of the present disclosure.

FIG. 2A is a diagram of a diplexer 200 according to an aspect of the present disclosure. The diplexer 200 includes a high band (HB) input port 212, a low band (LB) input port 214, and an antenna 216. A high band path of the diplexer 200 includes a high band antenna switch 210-1. A low band path of the diplexer 200 includes a low band antenna switch 210-2. A wireless device including an RF front end module may use the antenna switches 210 and the diplexer 200 to enable a wide range band for an RF input and an RF output of the wireless device. In addition, the antenna 216 may be a multiple input, multiple output (MIMO) antenna. Multiple input, multiple output antennas will be widely used for the RF front end of wireless devices to support features such as carrier aggregation.

Figure 2B:
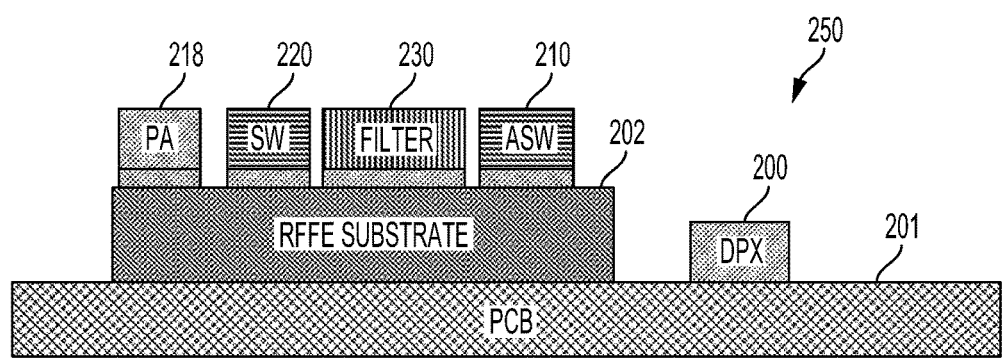
FIG. 2B is a diagram of a radio frequency (RF) front end module according to an aspect of the present disclosure.

FIG. 2B is a diagram of an RF front end module 250 according to an aspect of the present disclosure. The RF front end module 250 includes the antenna switch (ASW) 210 and diplexer 200 (or triplexer) to enable the wide range band noted in FIG. 2A. In addition, the RF front end module 250 includes filters 230, an RF switch 220 and power amplifiers 218 supported by a substrate 202. The filters 230 may include various LC filters, having inductors (L) and capacitors (C) arranged along the substrate 202 for forming a diplexer, a triplexer, low pass filters, balun filters, and/or notch filters to prevent high order harmonics in the RF front end module 250.

In this arrangement, the diplexer 200 is implemented as a surface mount device (SMD) on a system board 201 (e.g., printed circuit board (PCB) or package substrate). By contrast, the antenna switch 210 is implemented on the substrate 202 supported by the system board 201 of the RF front end module 250. In addition, the various LC filters of the filters 230 are also implemented as surface mount devices on the substrate 202 of the RF front end module 250. Although shown as filters 230, the LC filters including a low pass filter(s) and/or a notch filter(s) arranged throughout the substrate using pick and place technology to prevent high order harmonics in the RF front end module 250.

Unfortunately, arrangement of the various LC filters on the system board 201 (e.g., using an SMD attachment) consumes valuable RF front end real estate. In addition, implementation of the LC filters of the filters 230 using the SMD attachment involves additional cost to provide the separate surface mount connection of the various LC filters. Furthermore, complex substrate design is necessary to ensure electrical connection between the diplexer 200 on the system board 201 and the antenna switch 210 on the substrate 202. That is, the implementation of the diplexer 200 on the system board 201 using the SMD attachment involves additional cost to provide the separate connection to the antenna switch 210 on the substrate 202.

Various aspects of the disclosure provide techniques for integrating a diplexer/filter and an antenna switch on an RF front end package through a wafer level process. Aspects of the present disclosure involve 3D integration of filters/diplexers and an antenna switch for high Q-factor RF applications. In one arrangement, a silicon on insulator (SOI) implementation is described in which an antenna switch is fabricated in an SOI layer. This arrangement includes monolithically building a diplexer on an antenna switch to save cost in fabricating a diplexer package. In this arrangement, the LC filters and/or the diplexer are fabricated on an isolation layer on the SOI layer, with the SOI layer supported by dielectric layer on a glass substrate, as shown in FIG. 3.

The antenna switch may be surrounded by a cage structure (e.g., a Faraday cage), which provides isolation between the antenna switch and the diplexer. The cage may be arranged within a dielectric layer 303 to provide a connection between the components with little or no mismatch.

Figure 5:
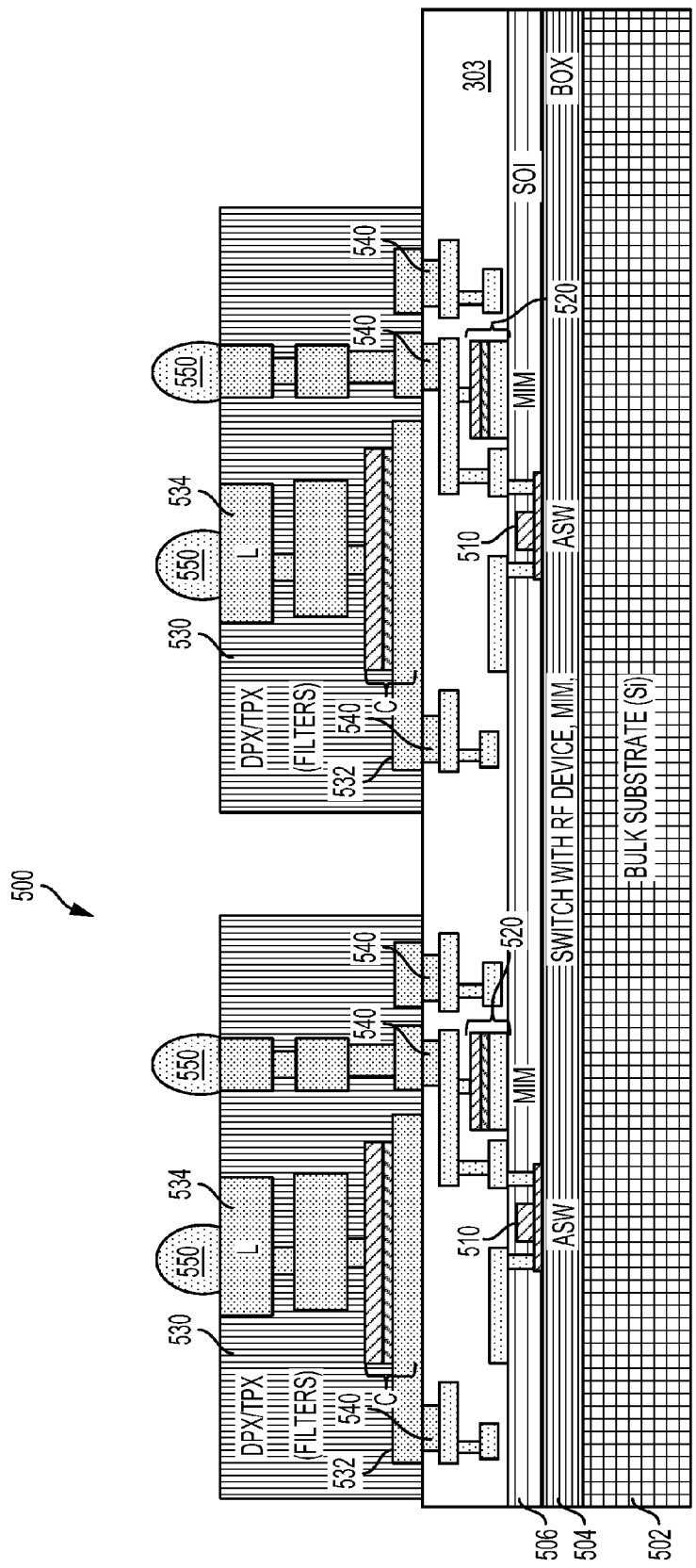
FIG. 5 illustrates an integrated radio frequency (RF) circuit structure according to further aspects of the present disclosure.

Alternatively, a lower performance implementation of the integrated RF circuit structure includes a bulk semiconductor package supporting an isolation layer (e.g., a buried oxide (BOX)), an SOI layer, and a dielectric layer. In this arrangement, the switch is fabricated on directly on a surface of the isolation layer, and the SOI layer is directly supported by a dielectric layer. In addition, the diplexer/filter is formed on the dielectric layer supported by the SOI layer, as shown in FIG. 5.

Figure 3:
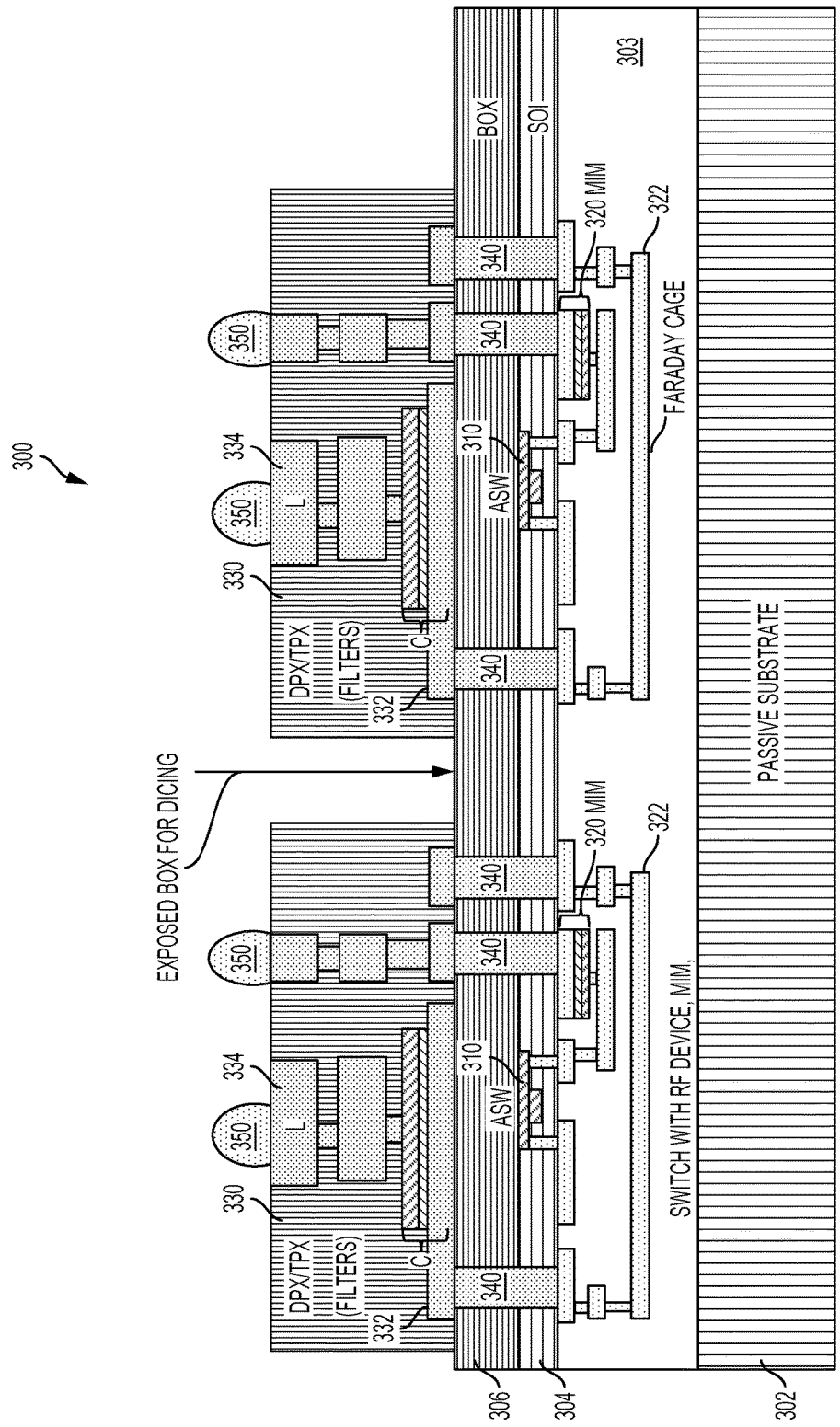
FIG. 3 illustrates an integrated radio frequency (RF) circuit structure according to an aspect of the present disclosure.

FIG. 3 illustrates an integrated radio frequency (RF) circuit structure 300 according to an aspect of the present disclosure. The integrated RF circuit structure 300 integrates a diplexer/filters 330 and an antenna switch (ASW) 310 on an RF front end package through a wafer level process. In particular, the components are implemented in (or on) a passive substrate 302. As described herein, the term "passive substrate" may refer to a substrate of a diced wafer or panel, or may refer to the substrate of a wafer/panel that is not diced. In one arrangement, the passive substrate is comprised of glass, air, quartz, sapphire, high-resistivity silicon, or other like passive material. The passive substrate may be a coreless substrate.

The integrated RF circuit structure 300 involves a 3D integration of diplexer/filters 330 and an antenna switch 310 for high Q-factor RF applications. In one arrangement, a silicon on insulator (SOI) implementation is described in which the antenna switch 310 is fabricated in the SOI layer 304. This arrangement includes monolithically building a diplexer/filters 330, including capacitors 332 and inductors 334, on an antenna switch 310 to save cost in fabricating a diplexer package.

In this arrangement, the diplexer/filters 330 are fabricated on an isolation layer 306 (e.g., a buried oxide (BOX) layer) on the SOI layer 304, with the SOI supported by a dielectric layer 303 on the passive substrate 302. The antenna switch 310 may be surrounded by a cage structure 322 that provides isolation between the antenna switch 310 and the diplexer/filters 330, while providing a connection between the components with little or no mismatch. A pad may contact the switch (e.g., the antenna switch), and an interconnect (e.g., of the cage structure 322) may be coupled to the filter (e.g., the diplexer/filters 330) through the pad. A metal insulator metal (MIM) capacitor 320 may be coupled to the antenna switch 310. In addition, conductive bumps 350 and vias 340 enable integration of the integrated RF circuit structure 300 in an RF front end module, for example, as shown in FIG. 1A or 1B. The integrated RF circuit structure 300 may be fabricated as shown in FIGS. 4A to 4F.

Figure 4A:
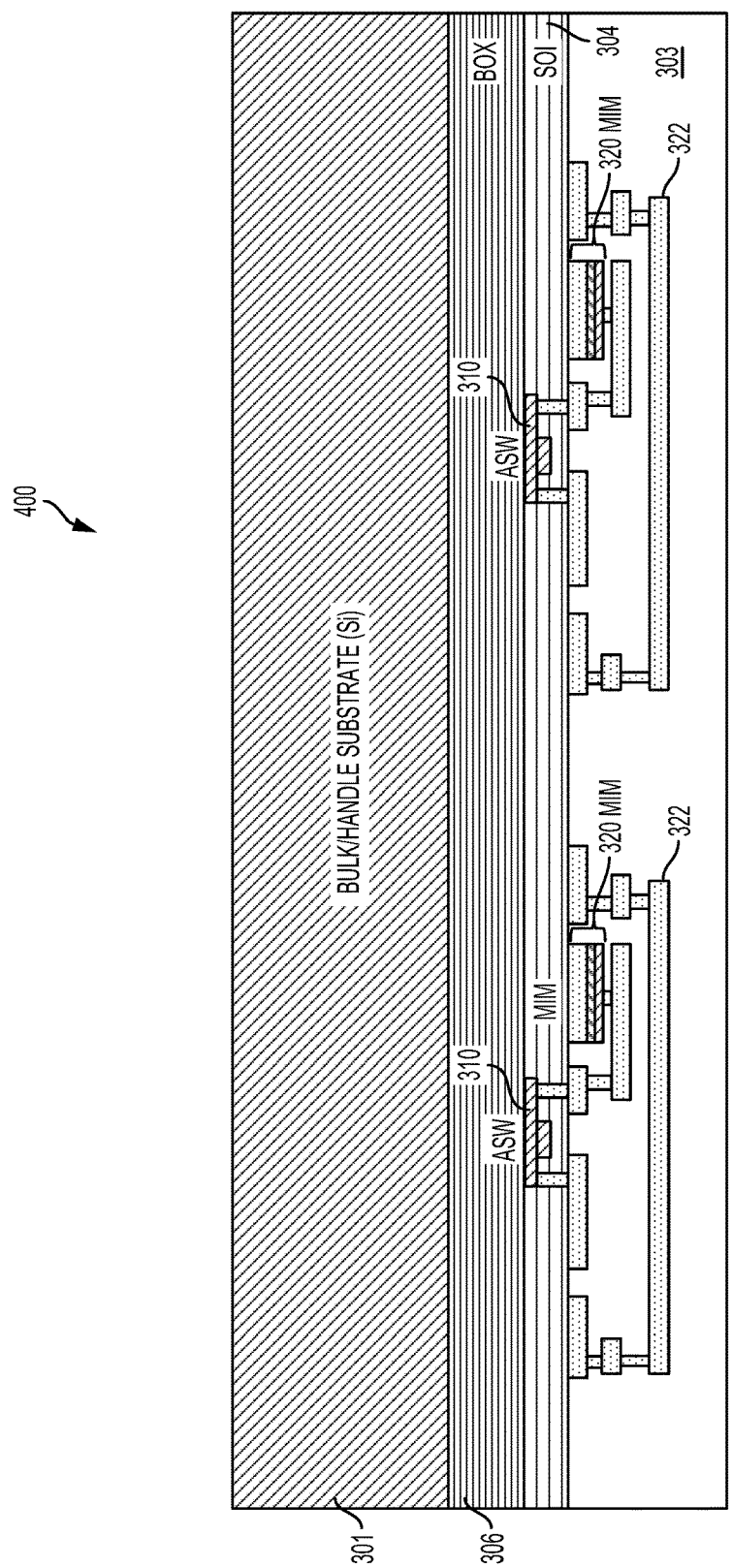
FIGS. 4A to 4F illustrate fabrication of the integrated radio frequency (RF) circuit structure of FIG. 3 according to aspects of the present disclosure.

FIG. 4A shows a first fabrication stage 400 of the integrated RF circuit structure 300 of FIG. 3 according to aspects of the present disclosure.

Representatively, the SOI implementation includes the formation of an isolation layer 306 (BOX) on a handle substrate 301 (e.g., a bulk wafer). The isolation layer 306 supports a silicon on an insulator (SOI) layer 304 and a dielectric layer 303. As shown in FIG. 3, the silicon on insulator layer 304 includes the antenna switch 310 (ASW) on a first surface of the isolation layer 306 opposite the handle substrate 301. In addition, the antenna switch 310 is coupled to the MIM capacitor 320 and surrounded by the cage structure 322 within the dielectric layer 303.

Figure 4B:
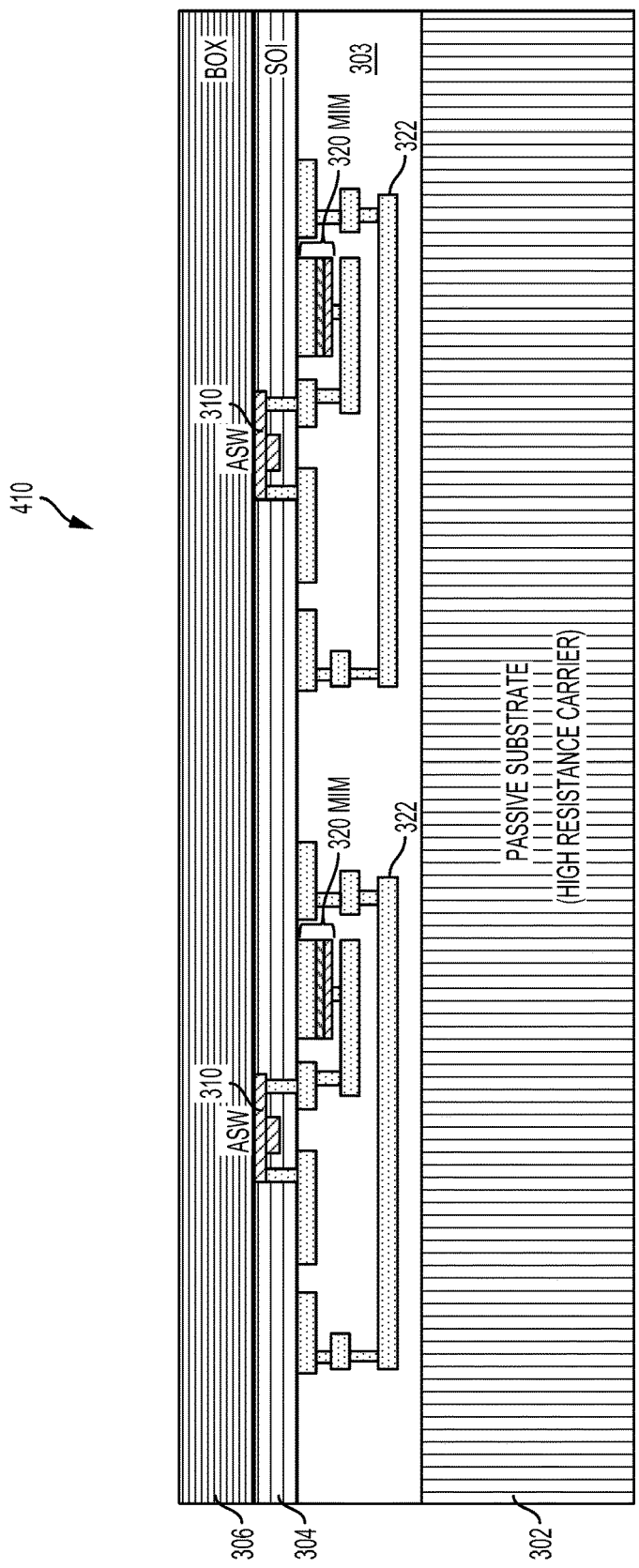

FIG. 4B shows a second fabrication stage 410 of the integrated RF circuit structure 300 of FIG. 3 according to aspects of the present disclosure. Representatively, the passive substrate 302 is attached to the dielectric layer 303 on the silicon on insulator layer 304. Once attached, the handle substrate 301 is removed from the isolation layer 306 (BOX) to expose a second surface of the isolation layer 306 to enable the formation of the diplexer/filters 330, as shown in FIGS. 4C to 4E.

Figure 4C:
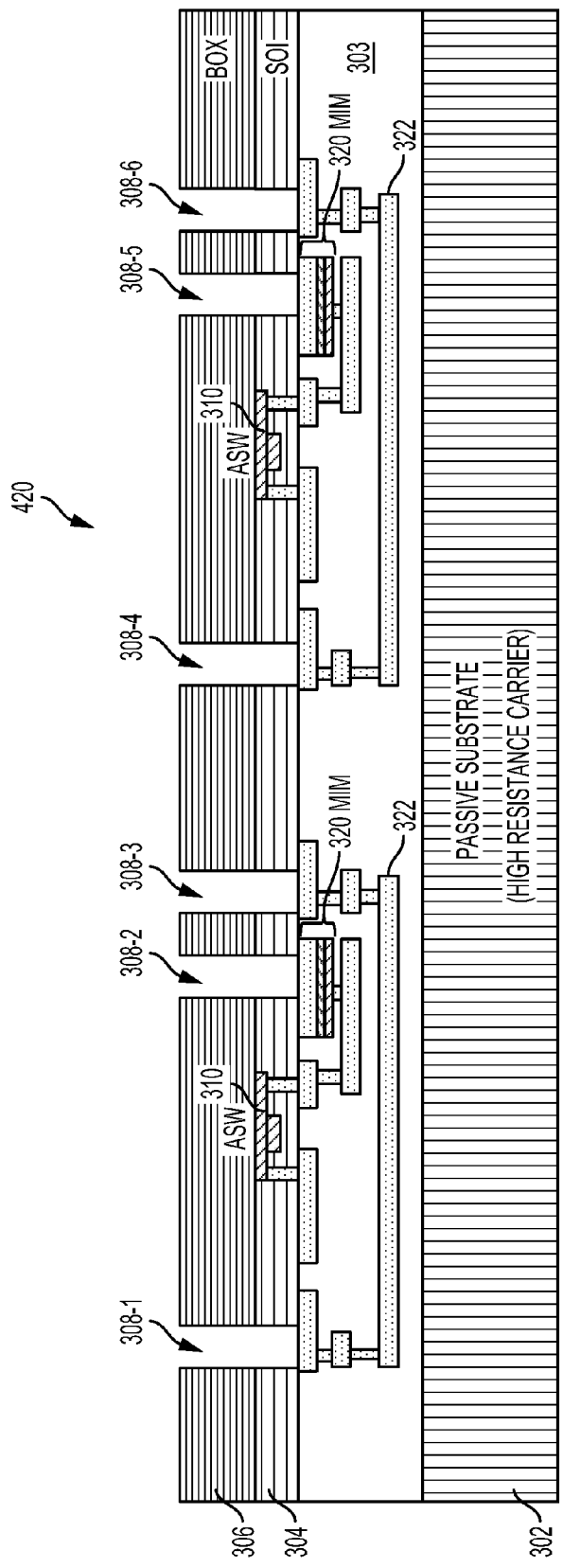

FIG. 4C shows a third fabrication stage 420 of the integrated RF circuit structure 300 of FIG. 3 according to aspects of the present disclosure. Representatively, first openings 308 (308-1, 308-2, 308-3, 308-4, 308-5, and 308-6) are formed in the isolation layer 306 and the silicon on insulator layer 304. The first openings 308 expose interconnects of the cage structure 322 as well as plates of the MIM capacitors 320 within the dielectric layer 303.

Figure 4D:
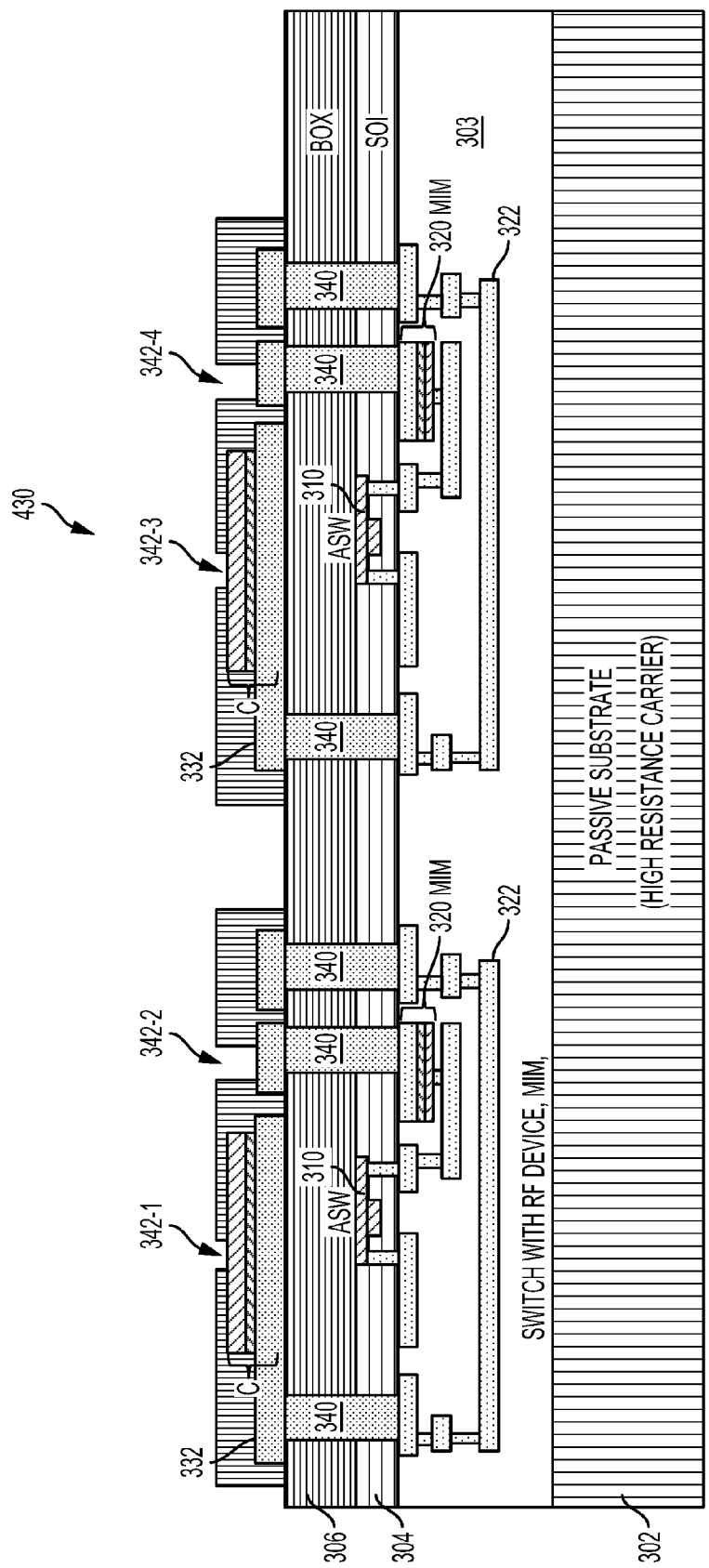

FIG. 4D shows a fourth fabrication stage 430 of the integrated RF circuit structure 300 of FIG. 3 according to aspects of the present disclosure. Representatively, the first openings 308 in the isolation layer 306 and the silicon on insulator layer 304 are filled with a first conductive material to form vias 340. In addition, MIM capacitors 332 of the diplexer/filters 330 are formed on the second surface of the isolation layer 306. In this arrangement, second openings 342 (342-1, 342-2, 342-3, and 342-4) in, for example, a dielectric layer (e.g., polyimide) of the diplexer/filters 330 are formed to expose a plate of the MIM capacitors 332.

Figure 4E:
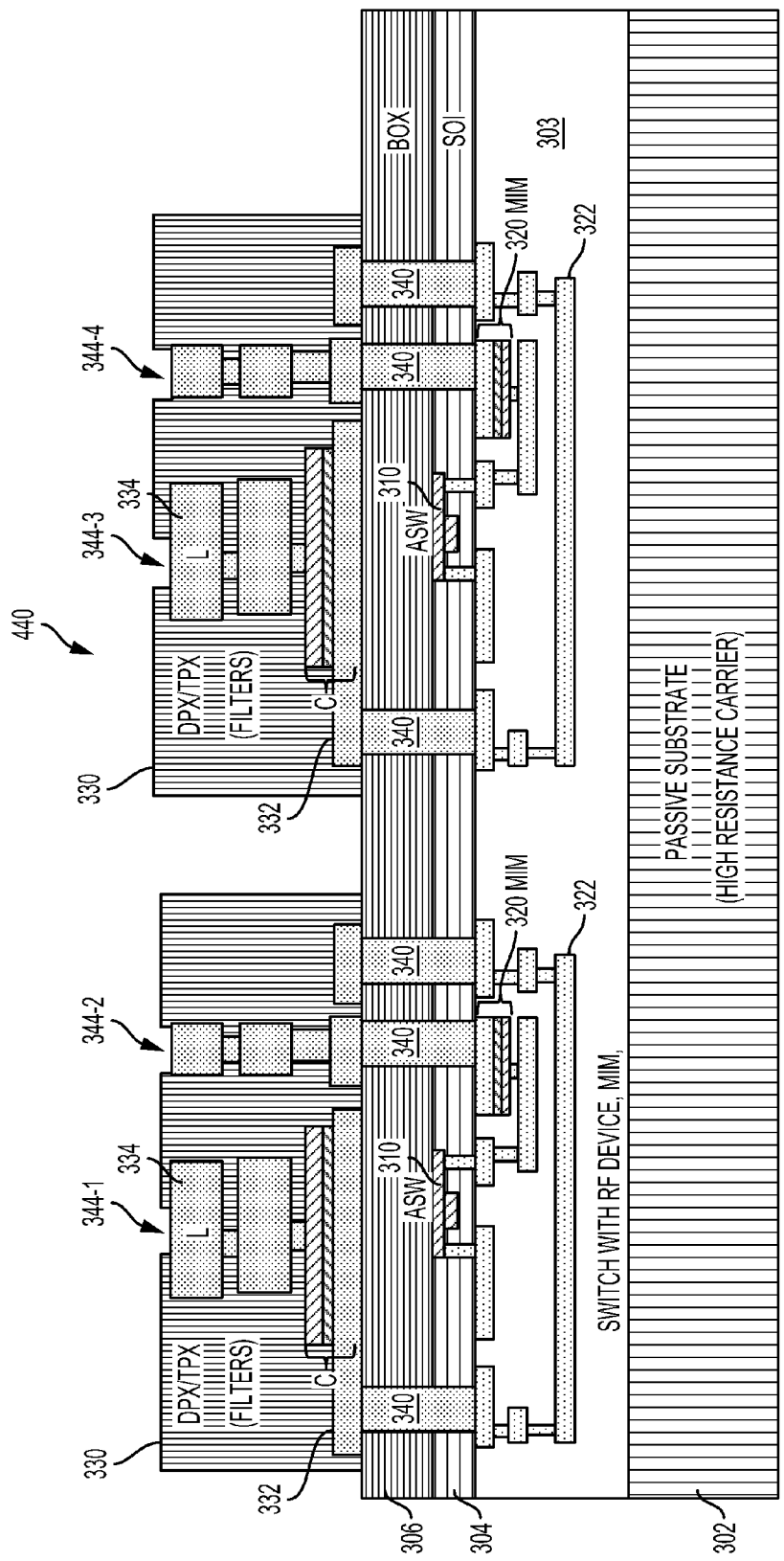

FIG. 4E shows a fifth fabrication stage 440 of the integrated RF circuit structure 300 of FIG. 3 according to aspects of the present disclosure. Representatively, the second openings 342 in the dielectric layer are filled with a second conductive material to form inductors 334 coupled to the MIM capacitors 332. In addition, third openings 344 (344-1, 344-2, 344-3, and 344-4) in the dielectric layer of the diplexer/filters 330 are formed to expose the inductors 334.

Figure 4F:
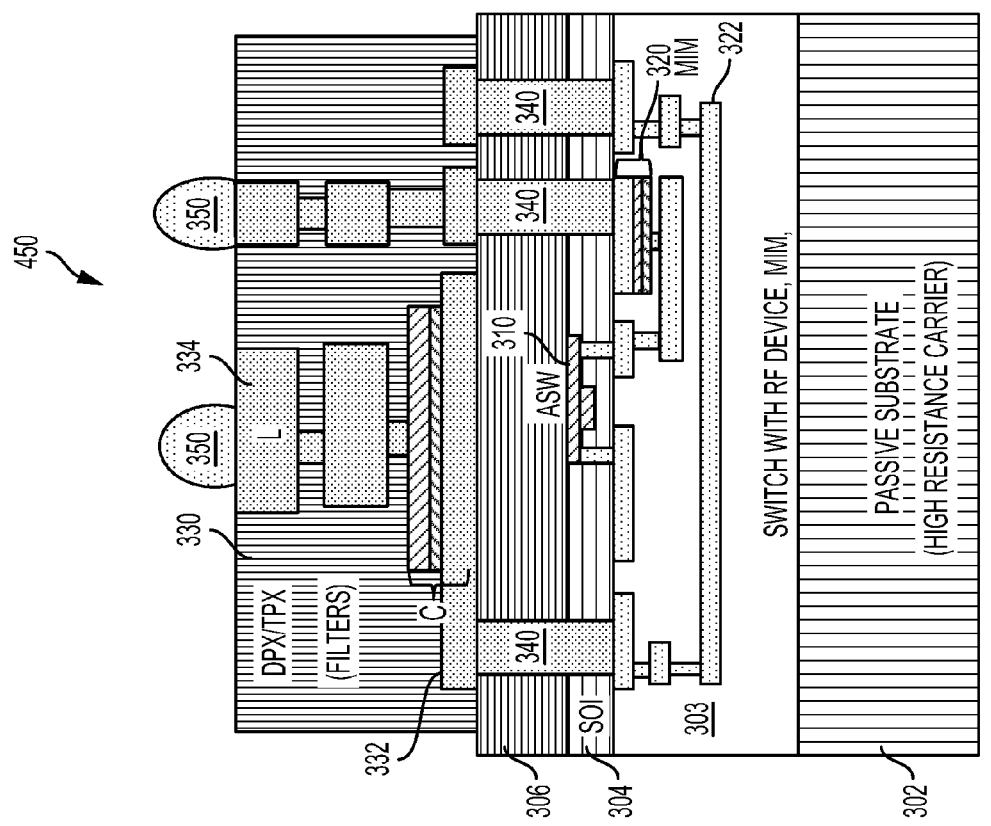

FIG. 4F shows a final fabrication stage 450 of the integrated RF circuit structure 300 of FIG. 3 according to aspects of the present disclosure. Representatively, the third openings 344 in the dielectric layer of the diplexer/filters 330 are filled with a conductive material to form conductive bumps 350 (e.g., a ball grid array) coupled to the inductors 334. In addition, the integrated RF circuit structure 300 is diced to provide an integrated RF circuit die to enable integration within an RF front end module, for example, as shown in FIG. 1A or 1B.

FIG. 5 illustrates an integrated RF circuit structure 500 according to another aspect of the present disclosure. The integrated RF circuit structure 500 also integrates a diplexer/filters 530 and an antenna switch (ASW) 510 on an RF front end package through a wafer level process. This arrangement, however, may provide a lower performance implementation that includes a handle semiconductor package (e.g., a bulk substrate) supporting an isolation layer 504 (e.g., a buried oxide (BOX)), a dielectric layer 503, and an SOI layer 506 on the dielectric layer 503. In this arrangement, the antenna switch 510 is fabricated on the isolation layer 504 and surrounded by the SOI layer 503. In addition, the diplexer/filters 530 are formed on the dielectric layer 503 supported by the SOI layer 506. A metal insulator metal (MIM) capacitor 520 may be coupled to the antenna switch 510. In addition, conductive bumps 550 enable integration of the integrated RF circuit structure 500 in an RF front end module, for example, as shown in FIG. 1A or 1B. The integrated RF circuit structure 500 may be fabricated as shown in FIGS. 6A to 6D.

Figure 6A:
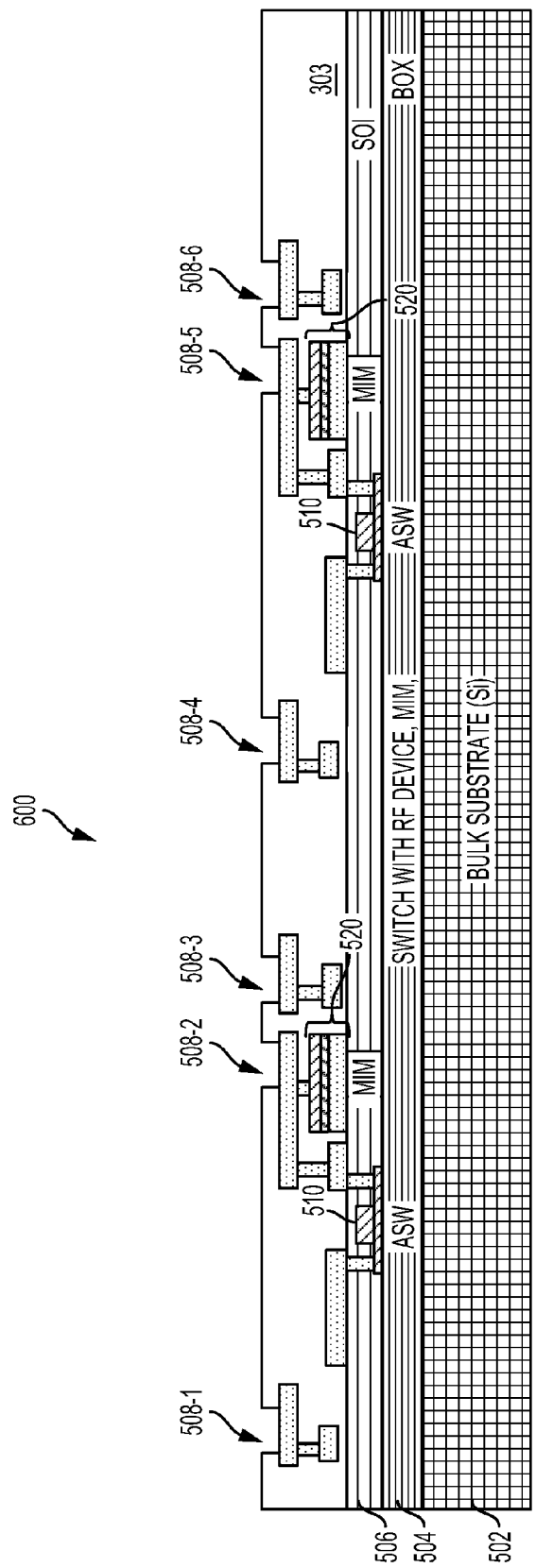
FIGS. 6A to 6D illustrate fabrication of the integrated radio frequency (RF) circuit structure of FIG. 5 according to aspects of the present disclosure.

FIG. 6A shows a first fabrication stage 600 of the integrated RF circuit structure 500 of FIG. 5 according to aspects of the present disclosure. Representatively, the handle substrate 502 supports the isolation layer 504 (BOX). In addition, the silicon on insulator layer 506 is arranged on a surface of the isolation layer 504 and supports the dielectric layer 503. The SOI layer 503 includes the antenna switch 510 on the surface of the isolation layer 504 and coupled to the MIM capacitor 520 in the dielectric layer 503. In this arrangement, first openings 508 (508-1, 508-2, 508-3, 508-4, 508-4, and 508-6) are formed in the dielectric layer 503. The first openings 508 expose an interconnect or interconnects of the antenna switch 510 as well as plates of the MIM capacitors 520.

Figure 6B:
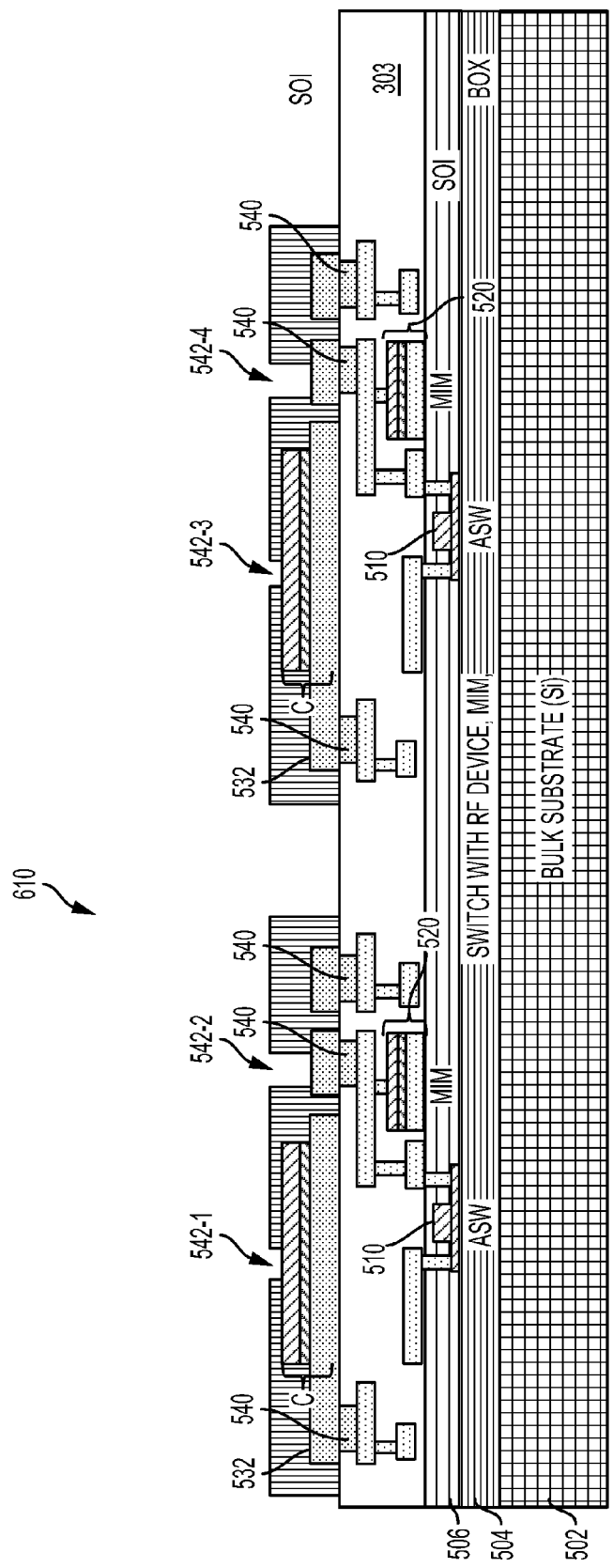

FIG. 6B shows a second fabrication stage 610 of the integrated RF circuit structure 500 of FIG. 5 according to aspects of the present disclosure. Representatively, the first openings 508 in the dielectric layer 503 are filled with a conductive material to form vias 540. In addition, MIM capacitors 532 of the diplexer/filters 530 are formed on the surface of the dielectric layer 503. In this arrangement, second openings 542 (542-1, 542-2, 542-3, and 542-4) in, for example, a dielectric layer (e.g., polyimide) of the diplexer/filters 530 are formed to expose plates of the MIM capacitors 532.

Figure 6C:
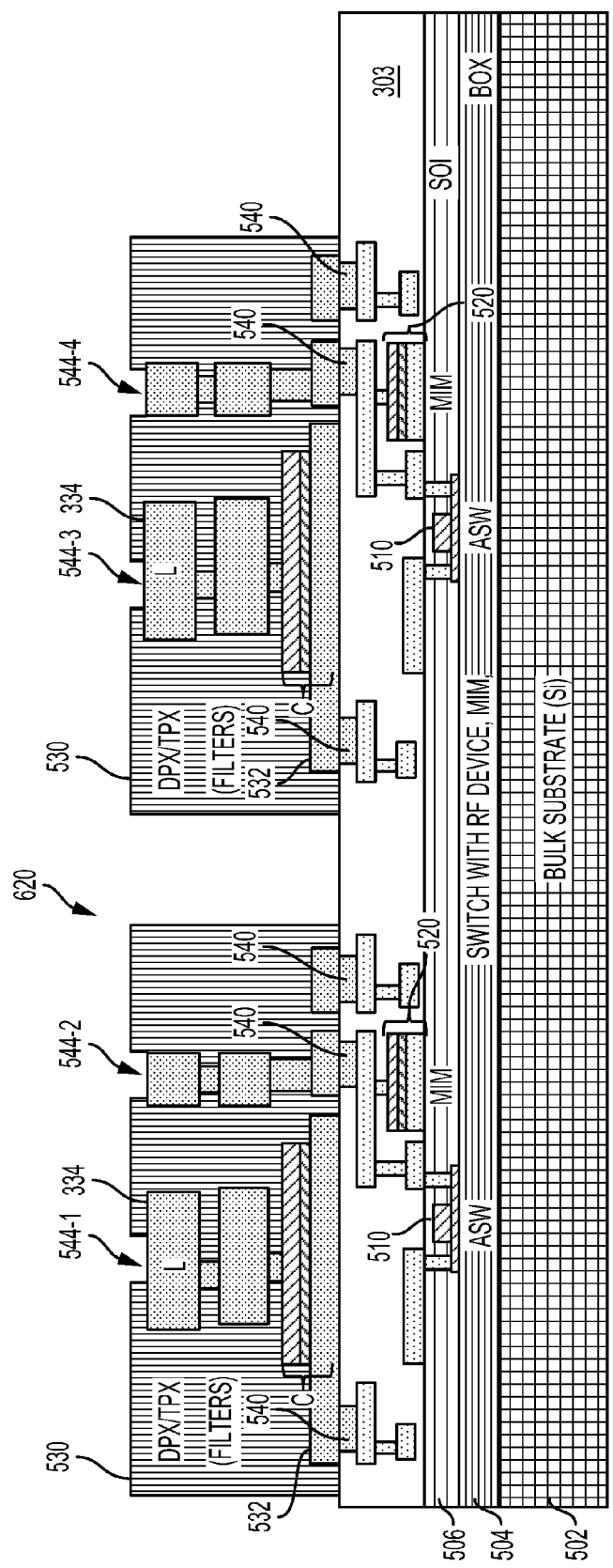

FIG. 6C shows a third fabrication stage 620 of the integrated RF circuit structure 500 of FIG. 5 according to aspects of the present disclosure. Representatively, the second openings 542 in the dielectric layer are filled with a conductive material to form inductors 534 coupled to the MIM capacitors 532. In addition, third openings 544 (544-1, 544-2, 544-3, and 544-4) in the dielectric layer of the diplexer/filters 530 are formed to expose the inductors 534.

Figure 6D:
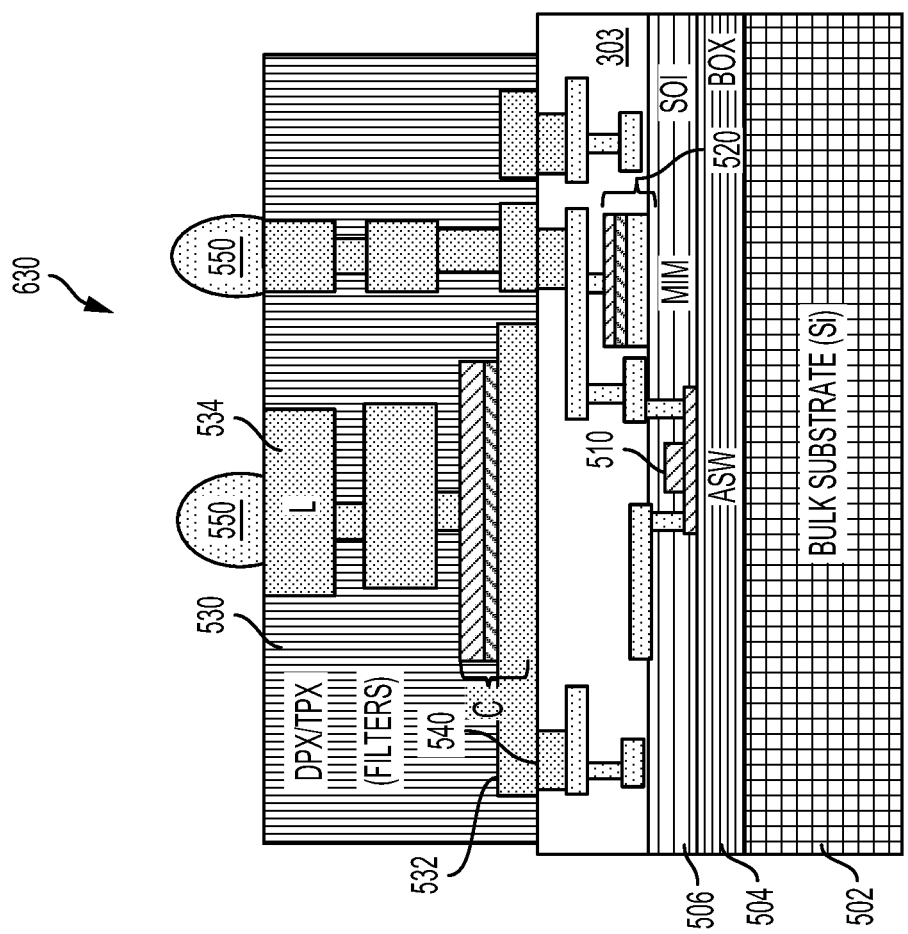

FIG. 6D shows a final fabrication stage 630 of the integrated RF circuit structure 500 of FIG. 5 according to aspects of the present disclosure. Representatively, the third openings 544 in the dielectric layer of the diplexer/filters 530 are filled with a conductive material to form conductive bumps 550 (e.g., a ball grid array) coupled to the inductors 534. In addition, the integrated RF circuit structure 500 is diced to provide an integrated RF circuit die to enable integration within an RF front end module, for example, as shown in FIG. 1A or 1B.

Figure 7:
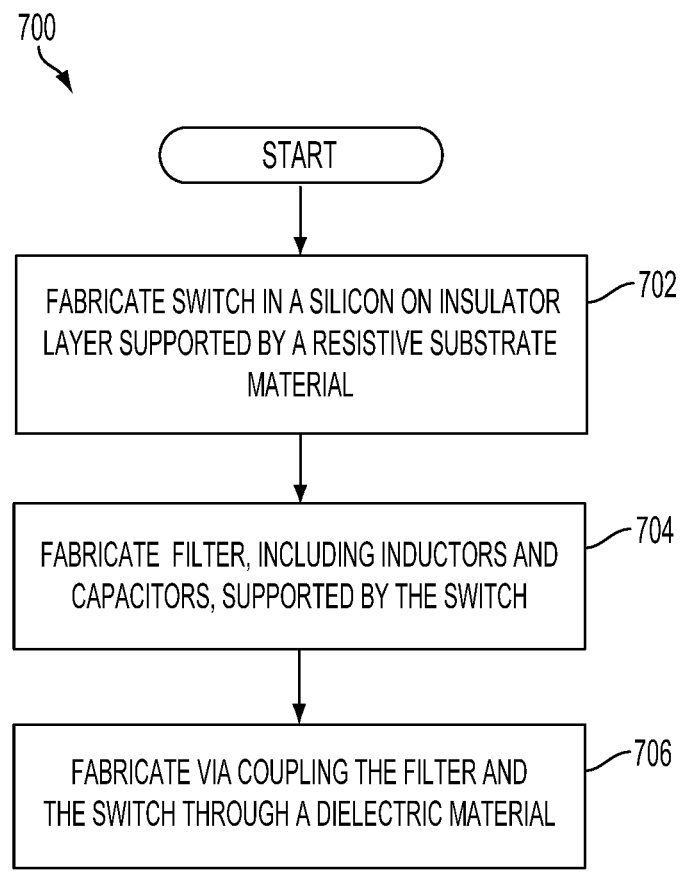
FIG. 7 is a process flow diagram illustrating a method of constructing an integrated radio frequency (RF) circuit structure according to aspects of the present disclosure.

FIG. 7 is a process flow diagram illustrating a method 700 of constructing an integrated radio frequency (RF) circuit structure according to an aspect of the present disclosure. In block 702, a switch is fabricated in a silicon on insulator (SOI) layer supported by a resistive substrate material. For example, as shown in FIG. 4A, an antenna switch (ASW) 310 is fabricated in a silicon on insulator (SOI) layer 304. In this arrangement, the antenna switch 310 is arranged on a first surface of an isolation layer 306 (e.g., a buried oxide (BOX) layer). In addition, a handle substrate 301 supports the isolation layer 306, the silicon on insulator layer 304, and a dielectric layer 303. Alternatively, as shown in FIG. 6A, an antenna switch is fabricated on a first surface of an isolation layer 504 (BOX), in which an opposing surface of the isolation layer is supported by a handle substrate 502.

Referring again to FIG. 7, in block 704, a filter, including inductors and capacitors, is fabricated on the switch. For example, as shown in FIG. 4D, capacitors 332 are formed on an opposing surface of the isolation layer 306. In FIG. 4E, inductors 334 are formed and coupled to the capacitors 332 to form the diplexer/filters 330. Alternatively, as shown in FIG. 6C, capacitors 532 are formed on a surface of a silicon on insulator layer 506, opposite a surface of the dielectric layer 503 on the isolation layer 504. In FIG. 6D, inductors 534 are formed and coupled to the capacitors 532 to form the diplexer/filters 530.

In block 706 of FIG. 7, a via is fabricated to couple the filter and the switch through a dielectric material. As shown in FIG. 4C, interconnects in the dielectric layer 303 are exposed through first openings 308. In FIG. 4D, the first openings 308 are filled with a conductive material to form vias 340 extending through the isolation layer 306 coupling the antenna switch 310 and the capacitors 332. Alternatively, in FIG. 6A, interconnects of the dielectric layer 503 are exposed through first openings 508. In FIG. 6B, the first openings 508 are filled with a conductive material to form vias 540 coupling the antenna switch 510 and the capacitors 532.

According to a further aspect of the present disclosure, integrated RF circuitry structures using both silicon on insulator technology and high resistance wafer technology are described. The integrated RF circuit structure includes means for switching an antenna arranged in a silicon on insulator (SOI) layer and supported by a resistive substrate material. The integrated RF circuit structure also includes a filter composed of inductors and capacitors and supported by the switching means. The switching means may be the antenna switch (ASW) 310/510, shown in FIGS. 3 and 5. In another aspect, the aforementioned means may be any module or any apparatus configured to perform the functions recited by the aforementioned means.

Multiple input, multiple output antennas will be widely used for the radio frequency (RF) frond end of wireless devices. The RF front end generally uses an antenna switch (ASW) and diplexer to enable a wide range band for an RF input and output. In addition, LC filters, including inductors (L) and capacitors (C), are also used in the RF front end for forming low pass and/or notch filters to prevent high order harmonics in the RF front end. Conventionally, the diplexers are implemented as surface mount devices (SMD) on a system board (e.g., printed circuit board (PCB) or package substrate). By contrast, the LC filters are implemented as surface mount devices on an RF front end substrate supported by the system board. The RF front end substrate generally includes power amplifiers, an RF switch, filters (e.g., the LC filters), and an antenna switch.

Unfortunately, implementation of the various LC filters along the RF front end substrate (e.g., using an SMD attachment) consumes valuable RF front end real estate. In addition, implementation of the LC filters and/or diplexer using the SMD attachment involves additional cost to provide the separate surface mount connection for the LC filters and/or diplexer. Furthermore, complex substrate design is necessary to ensure electrical connection between the diplexer on the system board and the antenna switch on the RF front end substrate. That is, the implementation of the diplexer on the system board using the SMD attachment involves additional cost to provide the separate connection to the antenna switch on the RF front end substrate.

Various aspects of the disclosure provide techniques for integrating a diplexer/filters and an antenna switch on an RF front end package through a wafer level process. Aspects of the present disclosure involve 3D integration of LC filters/diplexers and an antenna switch for high Q-factor RF applications. In one arrangement, a silicon on insulator (SOI) implementation is described in which an antenna switch is fabricated in the SOI layer. This arrangement includes monolithically building a diplexer on an antenna switch to save cost in fabricating a diplexer package. In this arrangement, the LC filters and/or the diplexer are fabricated on an isolation layer supported by the SOI layer, with the SOI supported by a passive substrate. The antenna switch may be surrounded by a cage structure in the dielectric layer, which provides isolation between the antenna switch and the diplexer and provides a connection between the components with little or no mismatch. Alternatively, a lower performance implementation includes a bulk semiconductor package supporting an isolation layer (e.g., a buried oxide (BOX)), an SOI layer, and a dielectric layer supported by the SOI layer. In this arrangement, the switch is fabricated on the isolation layer and surrounded by the SOI layer. In addition, the diplexer is formed on the dielectric layer supported by the SOI layer.

Figure 8:
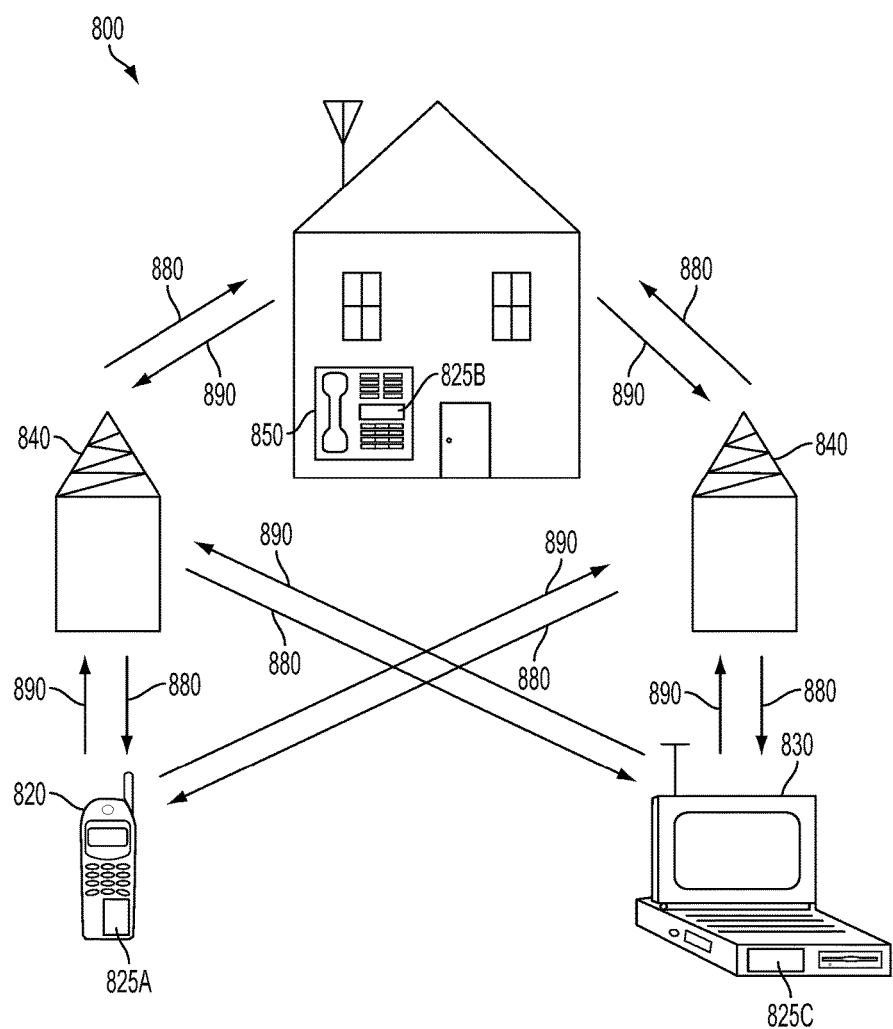
FIG. 8 is a block diagram showing an exemplary wireless communication system in which a configuration of the disclosure may be advantageously employed.

FIG. 8 is a block diagram showing an exemplary wireless communication system 800 in which an aspect of the disclosure may be advantageously employed. For purposes of illustration, FIG. 8 shows three remote units 820, 830, and 850 and two base stations 840. It will be recognized that wireless communication systems may have many more remote units and base stations. Remote units 820, 830, and 850 include IC devices 825A, 825C, and 825B that include the disclosed RF devices. It will be recognized that other devices may also include the disclosed RF devices, such as the base stations, switching devices, and network equipment. FIG. 8 shows forward link signals 880 from the base station 840 to the remote units 820, 830, and 850 and reverse link signals 890 from the remote units 820, 830, and 850 to base stations 840.

In FIG. 8, remote unit 820 is shown as a mobile telephone, remote unit 830 is shown as a portable computer, and remote unit 850 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 8 illustrates remote units according to the aspects of the disclosure, the disclosure is not limited to these exemplary illustrated units. Aspects of the disclosure may be suitably employed in many devices, which include the disclosed RF devices.

Figure 9:
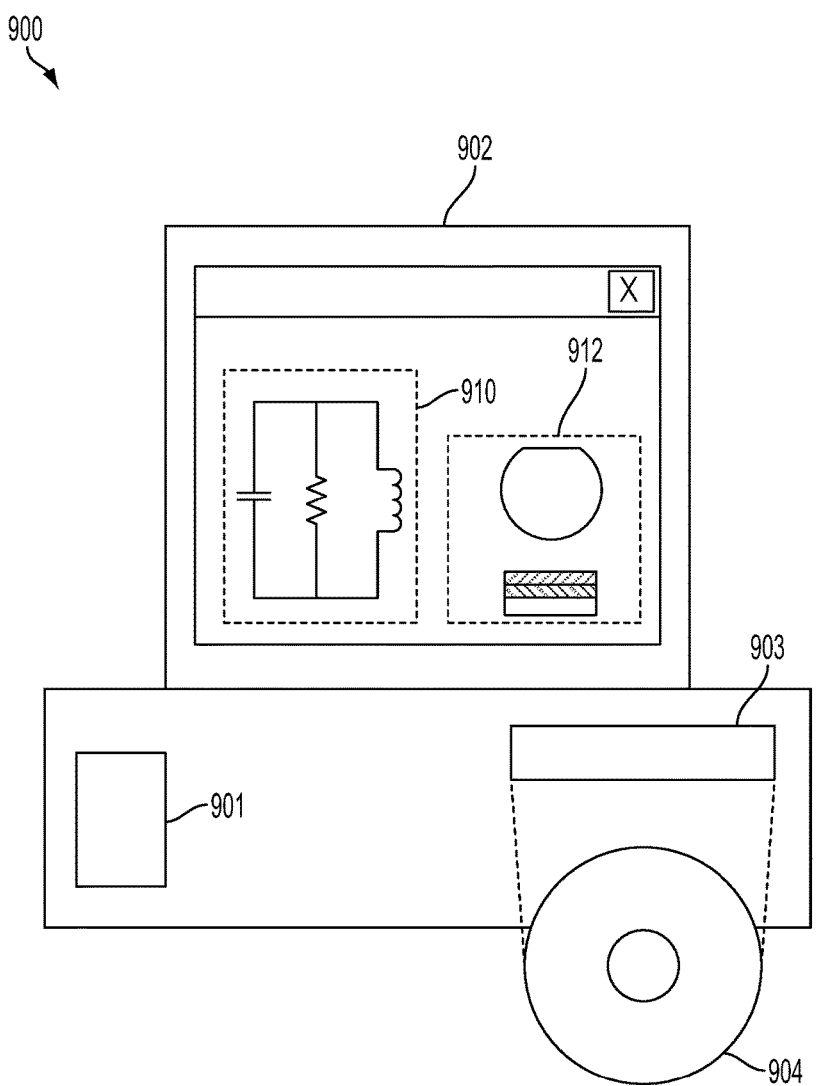
FIG. 9 is a block diagram illustrating a design workstation used for circuit, layout, and logic design of a semiconductor component according to one configuration.

FIG. 9 is a block diagram illustrating a design workstation used for circuit, layout, and logic design of a semiconductor component, such as the RF devices disclosed above. A design workstation 900 includes a hard disk 901 containing operating system software, support files, and design software such as Cadence or OrCAD. The design workstation 900 also includes a display 902 to facilitate design of a circuit 910 or a semiconductor component 912 such as an RF device. A storage medium 904 is provided for tangibly storing the circuit design 910 or the semiconductor component 912. The circuit design 910 or the semiconductor component 912 may be stored on the storage medium 904 in a file format such as GDSII or GERBER. The storage medium 904 may be a CD-ROM, DVD, hard disk, flash memory, or other appropriate device. Furthermore, the design workstation 900 includes a drive apparatus 903 for accepting input from or writing output to the storage medium 904.

Data recorded on the storage medium 904 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 904 facilitates the design of the circuit design 910 or the semiconductor component 912 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. An integrated radio frequency (RF) circuit structure, comprising:
a resistive substrate material;

an RF antenna switch in a silicon on insulator (SOI) layer supported by the resistive substrate material;

a buried oxide (BOX) layer directly coupled to the SOI layer; and a filter, comprising inductors and capacitors, arranged on a surface of the integrated RF circuit structure, opposite the resistive substrate material, in which the RF antenna switch is directly on a first surface of the BOX layer facing the resistive substrate material, and the filter is directly on a second surface opposite the first surface of the BOX layer and distal from the SOI layer directly supporting the first surface of the BOX layer.

2. The integrated RF circuit structure of claim 1, in which the filter comprises a diplexer, a triplexer, low pass filters, balun filters, and/or notch filters, arranged on the second surface opposite the first surface of the BOX layer.

3. The integrated RF circuit structure of claim 1, further comprising vias coupling the RF antenna switch on the second surface of the BOX layer to the filter on the second surface opposite the first surface and through the BOX layer.

4. The integrated RF circuit structure of claim 1, further comprising a pad contacting the RF antenna switch, and an interconnect coupled to the filter through the pad.

5. The integrated RF circuit structure of claim 1, in which the SOI layer is directly supported by a dielectric layer and the resistive substrate material is on the dielectric layer.

6. The integrated RF circuit structure of claim 1, further comprising a Faraday cage surrounding the RF antenna switch in a dielectric layer.

7. The integrated RF circuit structure of claim 1, further comprising a metal insulator metal (MIM) capacitor coupled to the RF antenna switch in the SOI layer, the MIM capacitor arranged in a dielectric layer supporting the SOI layer.

8. The integrated RF circuit structure of claim 1, integrated into an RF front end module, the RF front end module incorporated into at least one of a music player, a video player, an entertainment unit, a navigation device, a communications device, a personal digital assistant (PDA), a fixed location data unit, a mobile phone, and a portable computer.

9. An integrated radio frequency (RF) circuit structure, comprising:

a resistive substrate material;

means for switching an RF antenna arranged in a silicon on insulator (SOI) layer supported by the resistive substrate material;

a buried oxide (BOX) layer directly coupled to the SOI layer; and a filter, comprising inductors and capacitors, arranged on a surface of the integrated RF circuit structure, opposite the resistive substrate material, in which the RF antenna switching means is directly on a first surface of the BOX layer facing the resistive substrate material, and the filter is directly on a second surface opposite the first surface of the BOX layer and distal from the SOI layer directly supporting the first surface of the BOX layer.

10. The integrated RF circuit structure of claim 9, in which the filter comprises a diplexer, a triplexer, low pass filters, balun filters, and/or notch filters arranged on the second surface opposite the first surface of the BOX layer.

11. The integrated RF circuit structure of claim 9, further comprising vias coupling the RF antenna switching means on the first surface of the BOX layer to the filter on the second surface opposite the first surface and through the BOX layer.

12. The integrated RF circuit structure of claim 9, further comprising a pad contacting the RF antenna switching means, and an interconnect coupled to the filter through the pad.

13. The integrated RF circuit structure of claim 9, in which the SOI layer is directly supported by a dielectric layer and the resistive substrate material is on the dielectric layer.

14. The integrated RF circuit structure of claim 9, further comprising a Faraday cage surrounding the RF antenna switching means in a dielectric layer.

15. The integrated RF circuit structure of claim 9, further comprising a metal insulator metal (MIM) capacitor coupled to the RF antenna switching means, the MIM capacitor arranged in a dielectric layer supporting the SOI layer.

16. The integrated RF circuit structure of claim 9, integrated into an RF front end module, the RF front end module incorporated into at least one of a music player, a video player, an entertainment unit, a navigation device, a communications device, a personal digital assistant (PDA), a fixed location data unit, a mobile phone, and a portable computer.

17. A radio frequency (RF) front end module, comprising:

an integrated radio frequency (RF) circuit structure, comprising an RF antenna switch in a silicon on insulator (SOI) layer supported by a resistive substrate material, a buried oxide (BOX) layer coupled to the SOI layer, and a filter, comprising inductors and capacitors, arranged on a surface of the integrated RF circuit structure, opposite the resistive substrate material, in which the RF antenna switch is directly on a first surface of the BOX layer facing the resistive substrate material, and the filter is directly on a second surface opposite the first surface of the BOX layer and distal from the SOI layer directly supporting the first surface of the BOX layer; and an antenna coupled to an output of the RF antenna switch.

18. The RF front end module of claim 17, further comprising vias coupling the RF antenna switch on the first surface of the BOX layer to the filter on the second surface opposite the first surface and through the BOX layer.

19. The RF front end module of claim 17, in which the SOI layer is directly supported by a dielectric layer.

20. The RF front end module of claim 17, incorporated into at least one of a music player, a video player, an entertainment unit, a navigation device, a communications device, a personal digital assistant (PDA), a fixed location data unit, a mobile phone, and a portable computer.

* * * * *